United States Patent [19]

Campardo et al.

[11] Patent Number: 5,508,956
[45] Date of Patent: Apr. 16, 1996

[54] NONVOLATILE FLASH-EEPROM MEMORY ARRAY WITH SOURCE CONTROL TRANSISTORS

[75] Inventors: Giovanni Campardo, Bergamo; iuseppe Crisenza, Trezzo Sull'Adda; Marco Dallabora, Melegnano, all of Italy

[73] Assignee: SGS-Thomson Microelectronics S.r.l., Agrate Brianza, Italy

[21] Appl. No.: 214,049

[22] Filed: Mar. 15, 1994

[30] Foreign Application Priority Data

Mar. 18, 1993 [EP] European Pat. Off. ............ 93830109.0

[51] Int. Cl.⁶ ................................................ G11C 11/34
[52] U.S. Cl. .................. 365/185.17; 365/185.12; 365/185.27; 365/230.06
[58] Field of Search ......................... 365/185, 182, 365/218, 230.03, 900; 257/322, 344

[56] References Cited

U.S. PATENT DOCUMENTS

| | | | |
|---|---|---|---|
| 4,949,309 | 8/1990 | Rao | 365/218 |
| 4,958,321 | 9/1990 | Chang | 365/185 |
| 4,972,371 | 11/1990 | Komori et al. | 365/185 |
| 5,016,215 | 5/1991 | Tigelaar | 365/185 |
| 5,301,150 | 4/1994 | Sullivan et al. | 365/185 |
| 5,317,179 | 5/1994 | Chen | 257/344 |

FOREIGN PATENT DOCUMENTS

| | | | |
|---|---|---|---|
| 2099650 | 12/1982 | Japan | G11C 5/02 |
| WO89/06429 | 7/1989 | WIPO | G11C 11/40 |

*Primary Examiner*—A. Zarabian
*Attorney, Agent, or Firm*—David M. Driscoll; James H. Morris; Brett N. Dorny

[57] ABSTRACT

To reduce the number of depleted cells and the errors caused thereby, the memory array includes groups of control transistors corresponding to groups of memory cells. The control transistors of each group are NMOS transistors having the drain terminal connected to a control line. Each of the control transistors corresponds to a row portion of the memory array. Each control transistor has a control gate connected to a respective word line and a source region connected by a respective source line to the source regions of the memory cells in the same row and group.

10 Claims, 6 Drawing Sheets

5,508,956

NONVOLATILE FLASH-EEPROM MEMORY ARRAY WITH SOURCE CONTROL TRANSISTORS

BACKGROUND OF THE INVENTION

1. Field of the Invention

The present invention relates to a nonvolatile flash-EEPROM memory array.

2. Discussion of the Related Art

Flash-EEPROM memories are known to consist of an array including a number of cells arranged in rows and columns and connected to circuitry enabling them to be written (programmed), read and erased electrically, extremely rapidly, and with high density integration.

Flash-EEPROM memory cells are similar to those of EEPROMs, except that they present a very thin gate oxide layer (between the substrate and floating gate region).

Though highly promising at present, due to the above characteristics - electric erasability and high density-flash-EEPROM memories continue to present several drawbacks limiting their use.

One of the main drawbacks of this type of memory is due to dispersion of the threshold value of the erased cells (i.e. the voltage to be applied between the control gate and source regions for turning the cell on). Such dispersion, representable by a bell-shaped curve centered about a mean value, is due to the erase process employed, which consists in applying a high voltage to the source regions of the cells for extracting electrons from the floating gate (unlike EEPROM memories wherein erasure is effected by ultraviolet radiation). The outcome of electrically erasing the cells as described above depends on various factors: channel length (which may vary from one cell to another due to misalignment of fabrication masks or other technical problems); the erase voltage applied to each cell (the source regions of flash-EEPROM cells are formed in a single diffusion, which is connected by contacts and at regular intervals to a metal source line; due to the series resistance of the $N^+$ type diffusion, however, the erase voltage of the cells furthest from the contacts differs from and is lower than that of the closer cells); threshold voltage reached after programming (also variable); and weak erasure phenomena.

Another drawback typical of flash-EEPROM memories is the possibility of read errors, due to the presence of over-erased cells and the absence of selection transistors for each cell as on EEPROM memories.

It is an object of the present invention to provide a flash-EEPROM memory designed to overcome the aforementioned drawbacks.

SUMMARY OF THE INVENTION

According to the present invention, there is provided a flash-EEPROM memory array including a number of memory cells arranged in rows and columns and having drain regions connected to respective bit lines, source regions connected to respective sources lines, and control gate regions connected to respective word lines; a number of control transistors, at least one for each said word line; each said control transistor including a drain region connected to a control bit line, a gate region connected to a respective word line, and a source region connected to a respective source line.

The invention also includes a method of biasing a flash-EEPROM memory array comprising a number of memory cells arranged in rows and columns and having drain regions connected to respective bit lines, source regions connected to respective source lines, and control gate regions connected to respective word lines, and substrate regions housing said drain and source regions, wherein the potentials applied to the source and drain regions are mutually inverted with respect to standard potentials so as to apply a positive voltage to the source region with respect to the drain region during the cell reading step; so as to apply a positive voltage to the drain region with respect to the substrate region at the cell erase step; and so as to apply a positive voltage to the source region with respect to the drain region at the cell programming step.

BRIEF DESCRIPTION OF THE DRAWINGS

A preferred non-limiting embodiment of the present invention will be described by way of example with reference to the accompanying drawings, in which.

DETAILED DESCRIPTION

Figure 1:
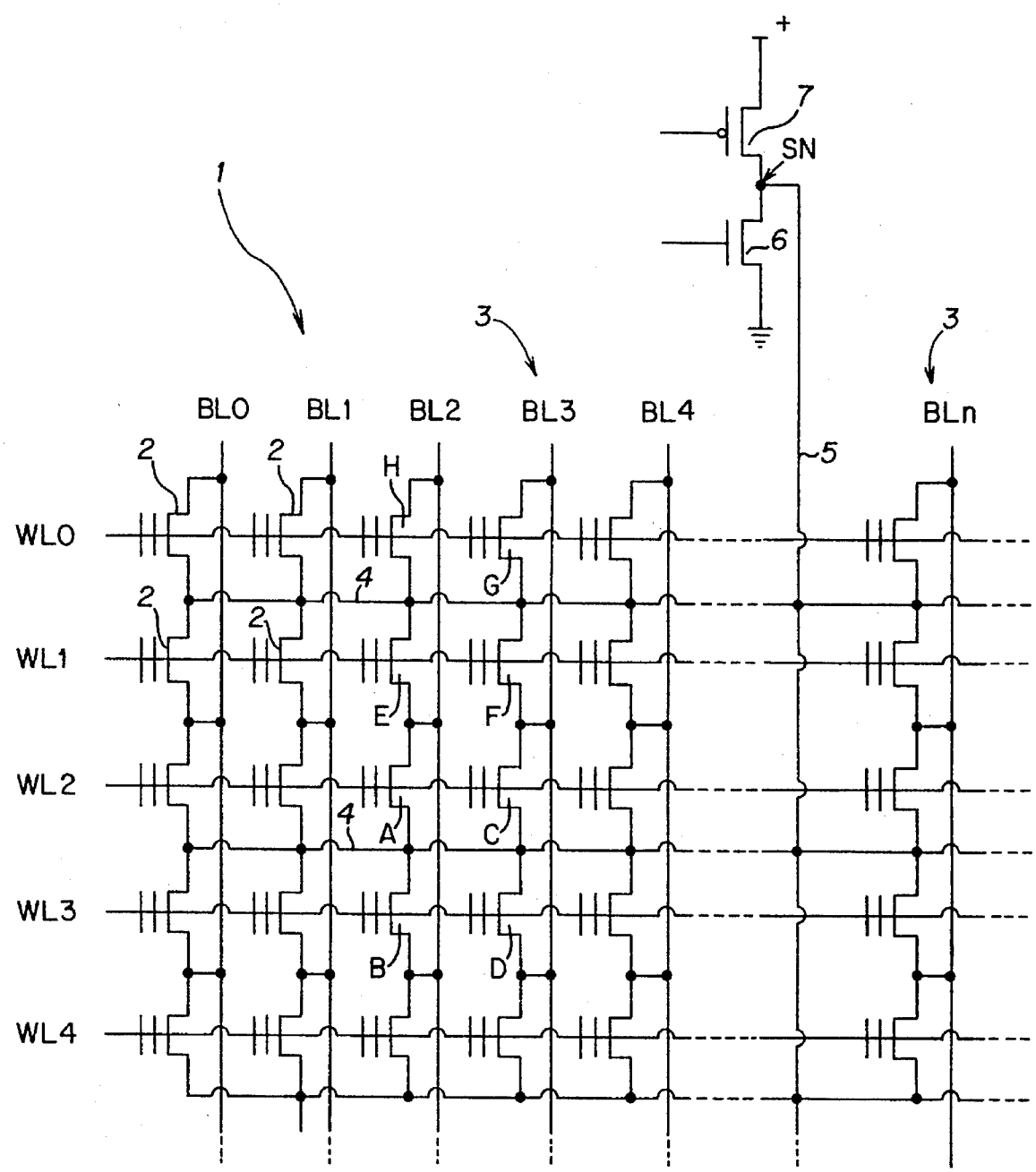
FIG. 1 shows an electric diagram of a portion of a known flash-EEPROM memory array.

For a clearer understanding of the present invention, reference will first be made to FIG. 1 showing the architecture of a portion of a known flash-EEPROM memory array (indicated as a whole by 1).

As shown in FIG. 1, array 1 comprises a number of cells 2 arranged in rows and columns and divided into sectors 3, each comprising a predetermined number of columns. The cells in the same row in each sector 3 present gate regions connected to the same word line WL0-WL4; the cells in the same column present drain regions connected to the same bit line BL0-BL4, BLn; and all the cells in the sector present mutually connected source regions. More specifically, the source regions of cells 2 in each row in the sector are mutually connected by a source line 4 (consisting of the same source diffusion, as shown more clearly in FIG. 2) common to each two adjacent rows. For each sector, a metal line 5 is provided extending parallel to the bit lines and contacting source lines 4. Metal line 5 is connected to a common source node SN in turn grounded or connected to the supply via two alternately controlled switches 6 and 7 forming part of the circuitry (external to the memory array, even though formed on the same chip).

Figure 2:
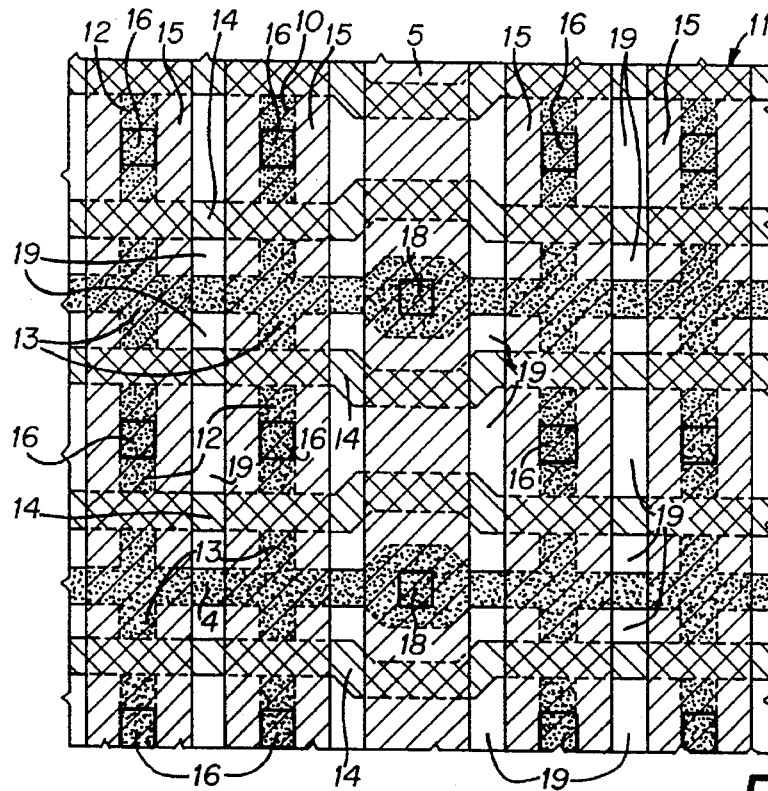
FIG. 2 shows the layout of the known FIG. 1 memory array.

An example layout of the FIG. 1 array is shown in FIG. 2, which shows an N type diffusion 10 formed in a P type substrate 11 (and forming drain and source regions 12 and 13 of cells 2 and source lines 4); polysilicon strips 14 (forming word lines WL); metal lines 15 (defining bit lines BL); drain contacts 16 between drain regions 12 and metal lines 15; metal line 5 with source contacts 18; and field oxide areas 19 surrounding and electrically separating cells 2.

As can be seen, to enable the formation of source contacts 18, the otherwise straight course of polysilicon strips 14 is "detoured" about contacts 18 at metal line 5, which configuration not only complicates the structure but also poses problems in terms of fabrication.

Figure 3:
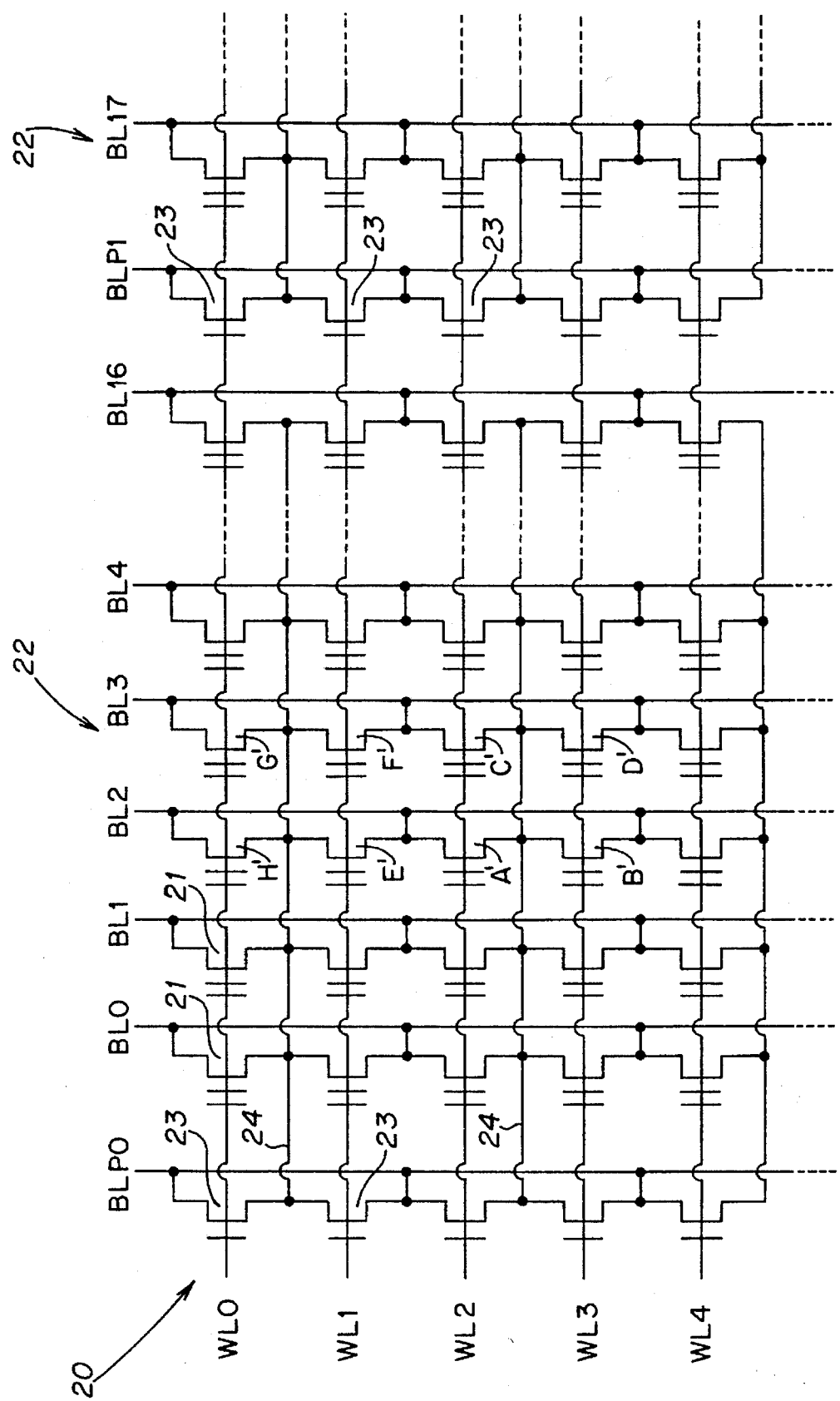
FIG. 3 shows an electric diagram, as in FIG. 1, of a flash-EEPROM memory in accordance with the present invention.

FIG. 3 shows the memory array 20 according to the present invention, which again comprises a number of cells 21 arranged in rows and columns. As in the known structure, the gate regions of cells 21 in the same row are connected to the same ward line WL0–WL4; the drain regions of the cells in the same column are connected to the same bit line BL0–BL4, . . . BL16, BL17 . . . ; and the cells are again grouped into sectors 22, in this case, each preferably comprising sixteen columns.

Unlike the FIG. 1 array, however, the adjacent cells 21 in each row in sector 22 present the source regions connected to that of a control or "pass" transistor 23. The pass transistors 23 in each sector 22 are mutually connected, and more specifically present the drain regions connected to a control line BLP0, BLP1, . . . extending parallel to bit lines BL. All the gate regions of pass transistors 23 in each row are connected to the respective word line WL0, WL1, . . . (and thus to one another and to the gate regions of cells 21 in the same row), and the source regions of pass transistors 23 and associated cells 21 are connected via respective source lines 24.

Pass transistors 23 are conventional N-channel MOS transistors, the only requisite of which is that the threshold voltage should be positive at all times, even under worst case conditions due to fabrication problems (process corners resulting from mask misalignment) and variations in temperature.

Figure 4:
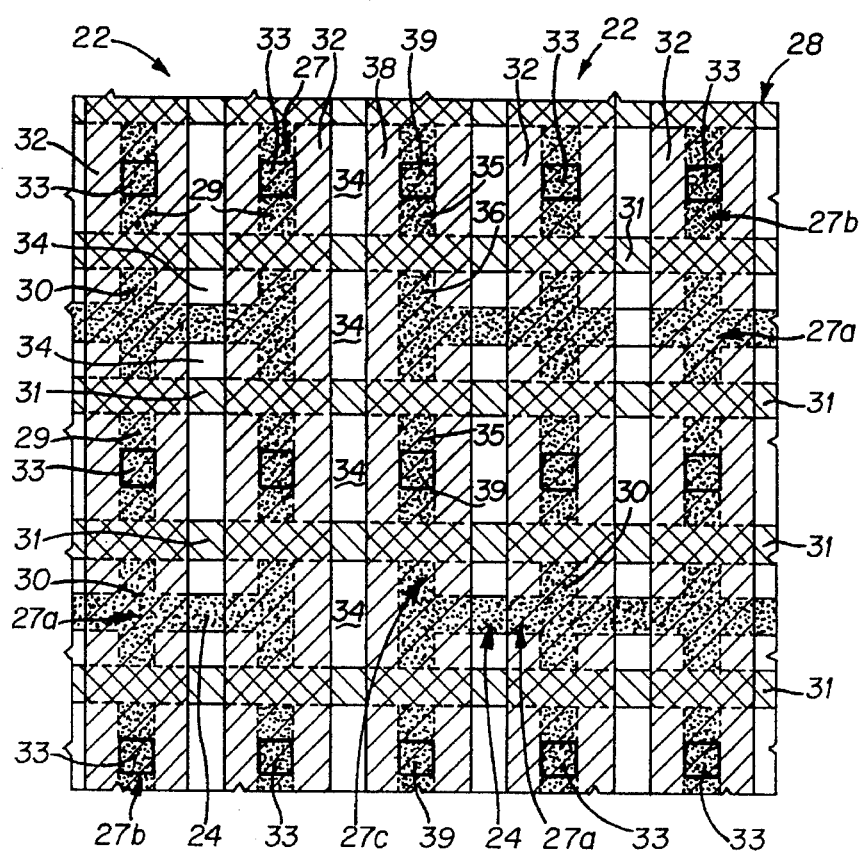
FIG. 4 shows the layout of the FIG. 3 flash-EEPROM memory array.

FIG. 4 shows the layout of part of memory array 20, in particular, part of two adjacent sectors 22. As in FIG. 2 relative to the known array, FIG. 4 shows an N type diffusion 27 formed in a P type substrate 28 (and forming the drain and source regions 29 and 30 of cells 21 and source lines 24); polysilicon strips 31 (forming word lines WL); metal lines 32 (defining bit lines BL); and drain contacts 33 between drain regions 29 of diffusion 27 and metal lines 32.

As in FIG. 2, diffusion 27 presents a gridlike arrangement with intersecting horizontal and vertical strips 27a, 27b (with the exception of the channel regions). Unlike the known layout, however, instead of being continuous, the horizontal strips 27a of diffusion 27 forming source lines 24 are interrupted at the end of each sector, and are separated by a field oxide layer 24, which also separates the drain regions 29 of cells 21 in adjacent columns. Pass transistors 23 are formed between one sector and another. More specifically, drain and source regions 35 and 36 of the pass transistors are formed in a vertical strip 27c (interrupted at the channel regions) formed by the same diffusion 27. A metal line 38, defining line BLP, extends over strip 27c, parallel to metal lines 32, and is connected electrically to drain regions 35 by drain contacts 39. Source regions 36 of pass transistors 23 are connected by horizontal strips 27a to source regions 30 of cells 21 in only one of the two adjacent sectors (in this case, the one to the right). The same polysilicon lines 31 forming the control gate regions of cells 21 also form the gate regions of pass transistors 23.

By virtue of the pass transistors, it is possible to invert the source and drain regions as regards the doping profile. In particular, to enable the cells to withstand the stress caused during erasure by the high voltage between the gate and source regions (12 V as of present), a proposal has already been made to provide for a graded substrate-source junction with an additional implant step, so that the source region consists of two parts: a deeper, more lightly doped part contacting the substrate (body); and a more heavily doped part facing the surface of the chip of semiconductor material.

Figure 5:
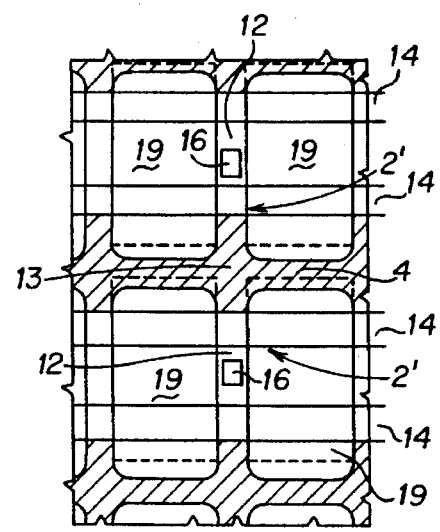
FIG. 5 shows a larger-scale view of a detail in FIG. 2.

Such a solution (not shown in the FIG. 2 layout for reasons of clarity) has nevertheless aggravated the effects of possible misalignment of the masks. In fact, in the event of misalignment between the poly2 mask (for shaping the second polysilicon layer forming the control gate regions and word lines) and the active area mask (defining the thick field oxide layer separating the regions in which the cells are to be formed), the rounded edges of the field oxide may penetrate beneath the gate of the cell, thus increasing the actual width of the channel and reducing the cell coupling factor. An example of this is shown in FIG. 5, in which the error is exaggerated for reasons of clarity, and which shows part of the FIG. 2 layout with the exception of metal lines 15. In the example shown, cell 2' presents the above problem, which is aggravated by heavy implantation for forming the enriched source regions (dotted line in FIG. 5). The problem (also known as "funnel effect") is further aggravated in the event of misalignment of the heavy implant mask (which presents elongated openings, the top and bottom edges of which roughly coincide with the center line of word lines 14), in which case, the implant may fail to entirely cover source regions 13.

Figure 6:
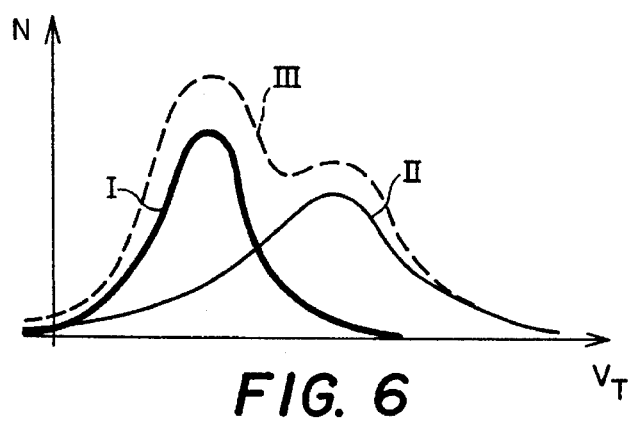
FIG. 6 shows a graph of threshold voltage distribution resulting from misalignment of the fabrication masks.

This therefore results in a variation in certain of the cell parameters, including the threshold voltage. In the example shown, only half of the cells are affected (cells 2'), thus resulting in a difference in threshold voltage distribution and in a double-bell-shaped curve as shown in FIG. 6, which shows the number of cells N with a threshold voltage $V_T$. FIG. 6 shows three curves: curve I relative to the aligned cells (or, better, in which misalignment has no effect on the threshold voltage); curve II relative to the cells affected by misalignment; and curve III (double maximum curve) relative to both types of cell (aligned and misaligned).

Such a distribution pattern is particularly disadvantageous in that, in addition to extending the threshold voltage range, it also results in an increase in the number of overerased (depleted) cells with a negative threshold voltage, i.e. which may be turned on even when not selected for reading.

Figure 7:
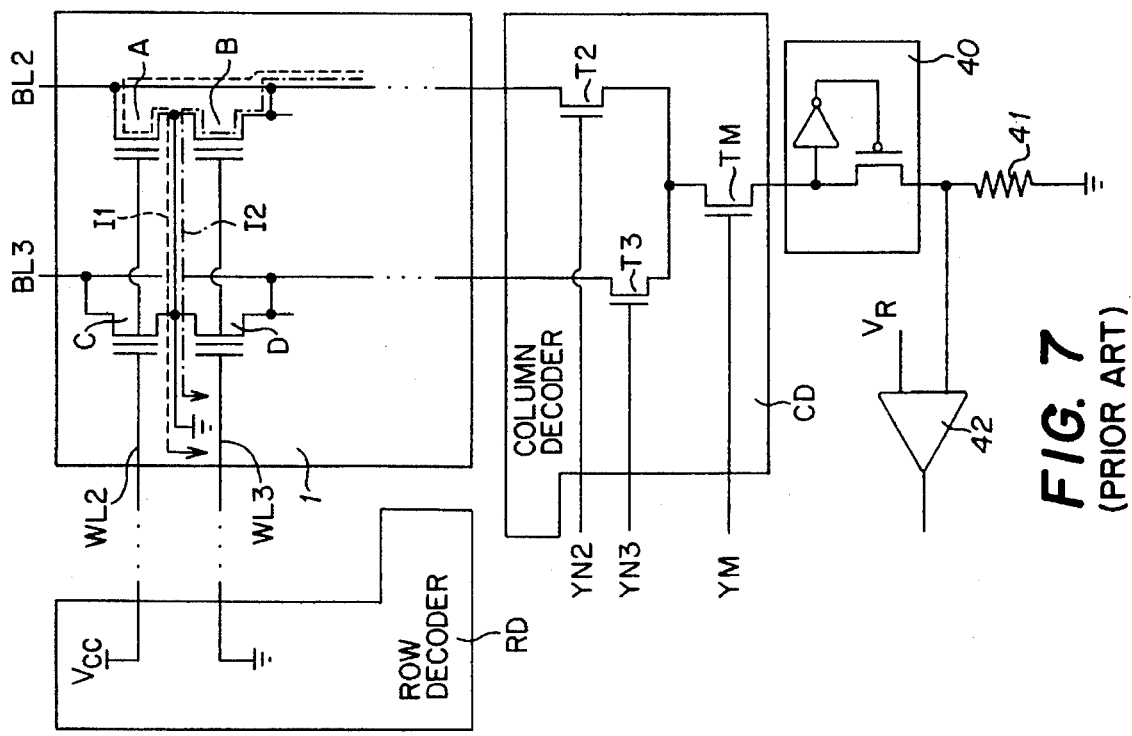
FIG. 7 shows the decoding architecture of a known array.

To explain the above problem, FIG. 7 shows four cells 2, indicated A–D, forming part of two rows and two consecutive columns, and connected to word lines WL2, WL3 and bit lines BL2, BL3. At one end of bit lines BL, a column decoder CD is provided including selection transistors T2, T3, one for each column and controlled by respective column selection signals YN2, YN3. Selection transistors T2, T3 are connected in known manner to a transistor TM supplied with signal YM; a current/voltage converter 40 for preventing an undesired increase in drain voltage; a load 41; and a sense amplifier 42, one input of which is connected to a terminal of load 41, and the other input of which is supplied with reference voltage $V_R$.

Assuming cell A is to be read, and that all the cells are in ideal condition (no depleted cells). By means of a row decoder RD, word line WL2 is brought in known manner to supply voltage $V_{cc}$ (usually 5 V); the other word lines (WL3) are grounded; the source regions of all the cells are grounded; the addressed bit line BL2 is brought to a voltage lower than the supply voltage (usually 1 V) by T2 and TM; and the other bit lines (BL3) are virtually grounded. In the above situation, if cell A is erased, it begins conducting, and current flows along line BL2 through A to ground (dotted line I1); and all the other cells connected to the same column BL2 remain inoperative by virtue of presenting a zero source-drain voltage drop $V_{gs}$. Conversely, if cell A is written, it does not switch on, and no current is supplied. The presence or absence of current along line BL2 is detected by sense amplifier 42, which accordingly generates a logic signal. If, on the other hand, cell B is so depleted as to present a zero or negative threshold voltage, and comes on even when $V_{gs}= 0$, thus resulting in the passage of current I2 along bit line BL2. This current may be misinterpreted by amplifier 42 as being relative to a virgin cell, thus resulting in a read error.

Figure 8:
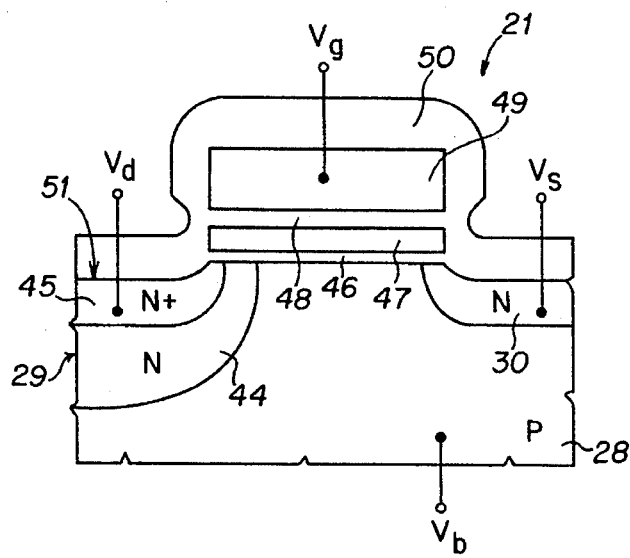
FIG. 8 shows a cross section of a memory cell in accordance with the present invention.

The problem of misaligned cells resulting in a probable increase in the number of depleted cells is solved here by inverting the enriched regions, as shown in the FIG. 8 cross section of a cell 21, wherein the same reference numbers as in FIG. 4 are employed, with the exception of the drain region, which is simplified in FIG. 4 for reasons of clarity. FIG. 8 shows a P type substrate 28 (set to voltage $V_b$) with an N type source diffusion 30 (set to voltage $V_s$) and a drain region 29 (set to voltage $V_d$). As can be seen, drain region 29 comprises a first deeper N type portion 44; and a second portion 45 facing the larger surface 51 of the substrate, of N+ type conductivity, and therefore more heavily doped as compared with portion 44 by virtue of phosphorous implantation. FIG. 8 also shows a thin gate oxide layer 46; a floating gate region 47; an interpoly dielectric layer 48; a control gate region 49 (consisting of a polysilicon strip 31 and set to voltage $V_g$); and a protective oxide layer 50.

This therefore results in a graded substrate-drain junction and a sharp substrate-source junction (formed by arsenic implantation), thus inverting the characteristics of the two junctions as compared with the known solution. As such, in the event of misalignment of the poly2 and active area masks, no penetration occurs, beneath the gate region, of highly doped regions (in this case, regions 12 as opposed to regions 13 in FIG. 5), thus reducing the increase in capacitive coupling and greatly reducing dispersion of the characteristic quantities of the cell (particularly threshold voltage). Threshold voltage distribution may therefore be represented by a single bell-shaped curve, similar to I in FIG. 6, indicating a reduction in the number of overerased or depleted (negative $V_T$) cells.

Pass transistors 23 also prevent any direct contribution which may be made by any depleted cells on the same bit line during reading (as in the known memory described with reference to FIG. 7). In fact, all the cells on the same addressed bit line (with the exception of the one whose source region is connected to the selected cell) present floating source regions, by virtue of the respective pass transistors being turned off (the respective control gate regions are grounded and pass transistors present strictly positive threshold voltages, as described). For example, if the cell connected to bit line BL0 and word line WL0 is selected, all the cells connected to the same bit line BL0 (except for the selected cell and the one connected to word line WL1) present floating source regions as opposed to grounded source regions, as in the known array, so that no current can be conducted from the selected bit line BL0 to ground. What is more, the cell connected to the selected cell, even if slightly depleted, is normally also prevented from coming on by virtue of the pass transistor 23 connected to the selected word line WL0 being on and maintaining line 24 connected to it at the voltage of BLP0. Consequently, the cell connected to the selected cell presents a source region at said potential fixed by line BLP0, a grounded control gate region, and therefore a negative $V_{gs}$ voltage, so that it must be seriously depleted for it to be turned on.

The presence of pass transistors 23 for each given number of cells 21 also provides for reducing source capacitance (the capacitance at the source-body junction) and consequently for reducing the displacement current due to capacitive charging of source line 24 during erasure, which current represents a noise and must therefore be kept as low as possible. As already stated, by virtue of pass transistors 23, displacement current is reduced as compared with known arrays, and, above all, is constant and independent of the length of the bit line, unlike known arrays in which capacitance, and consequently displacement current, increases linearly alongside an increase in the length of the bit line.

The advantages afforded in terms of improved electrical performance of memory array 20 are further enhanced by a new method of biasing the array, whereby, as compared with the known biasing method, the potentials applied to the source and drain regions are inverted, as described in detail below by way of comparison with the known method and with reference to the read, erase and programming steps of array 20.

ARRAY 20: READ

According to the known technique (FIG. 7), a cell is read by biasing the control gate region of the cell to supply voltage $V_{cc}$ (e.g. 5 V) via word line WL, grounding the source region, and biasing the drain region to a low voltage, say, of 1 V.

According to a preferred embodiment of the read method according to the present invention, line BLP is brought to supply voltage $V_{cc}$; the selected bit line is brought to a voltage slightly below $V_{cc}$ (e.g. $V_{cc}$=1 V); the nonselected bit lines are brought to $V_{cc}$; the selected word line is brought to a voltage above $V_{cc}$; and the nonselected word lines are grounded (V=0 V).

Figure 9:
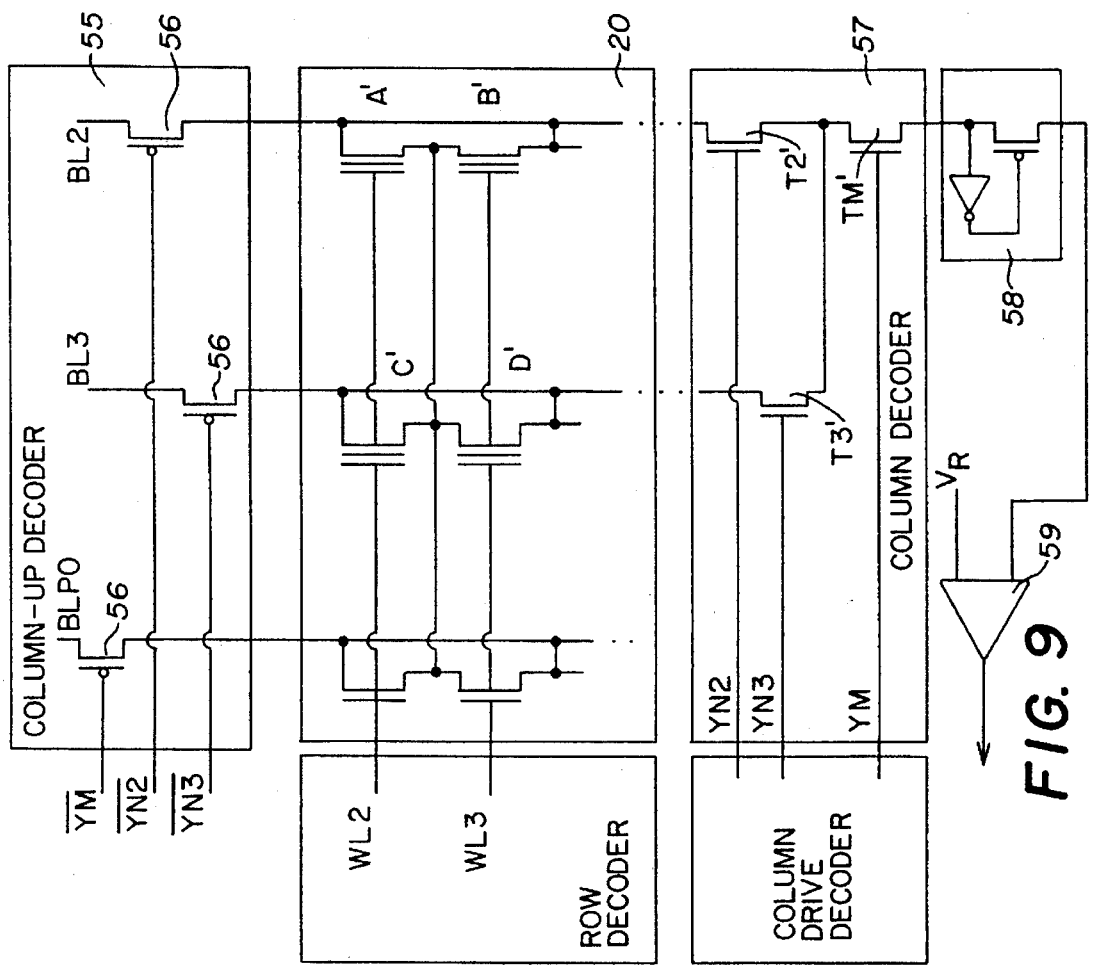
FIG. 9 shows the decoding architecture of the array according to the present invention.

A suitable architecture for column decoding the memory array according to the present invention and employing the above method is shown by way of example in FIG. 9, which, like FIG. 7, shows four cells A', B', C' and D' of array 20 connected to bit lines BL2, BL3 and word lines WL2, WL3; and two pass transistors PTO2, PTO3 connected respectively to word lines WL2, WL3 (besides of to the same control line BLP0). At one end of bit lines BL and control line BLP, a column-up decoder 55 is provided comprising a number of (e.g. P-channel) MOS load transistors 56 series connected respectively along bit lines BL and control line BLP, and supplied with respective control signals YM, YN2, YN3 at the gate terminals. Provision is also made for a column-down decoder 57 similar to decoder CD in FIG. 7 and comprising a number of decoding transistors T2', T3', . . . , one for each bit line BL and of the opposite type to load transistors 56 (in the example shown, N-channel). One terminal of each decoding transistor T2', T3', . . . is connected to a common terminal of a transistor TM' supplied with a control signal YM. The other terminal of transistor TM' is connected to a current/voltage conversion stage 58 similar to 40 and interposed between decoder 57 and one input of a sense amplifier 59, the other input of which is supplied with reference voltage $V_R$ and operates in the same way as amplifier 42 in FIG. 7.

Column-down decoder 57 provides in known manner for connecting the addressed bit line to sense amplifier 59, and column-up decoder 55 for biasing the nonselected bit lines to supply voltage $V_{cc}$ via load transistors 56.

The read method according to the present invention provides for reducing the number of depleted cells which may operate erroneously during reading and so impair reading accuracy.

The presence of depleted cells in fact may result in the formation of parasitic current conduction paths, even in the event the source terminals of the nonaddressed cells are floating.

Figure 10:
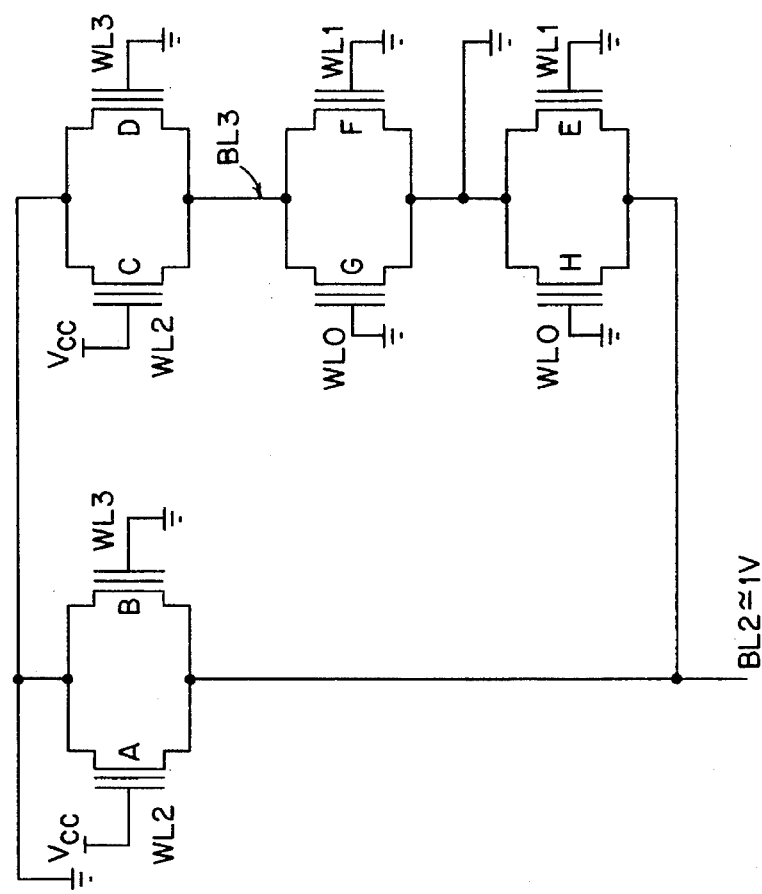
FIG. 10 shows the connection of a number of cells in the known FIG. 1 array.

Supposing, for example, we wish to read cell A in FIG. 1 connected to word line WL2 and bit line BL2; and that cells H, E and B are connected to the same bit line BL2 and to respective word lines WL0, WL1, WL3; and cells G, F, C and D are connected to bit line BL3 and to respective word lines WL0, WL1, WL2, WL3, as shown differently in FIG. 10. As can be seen, in addition to the possibility of error due to the direct current of cell B connected to the same bit line BL2, if depleted (as explained above), a further contribution may also be made by any depleted cells along the parasitic path formed by cells C, G and H.

Figure 11:
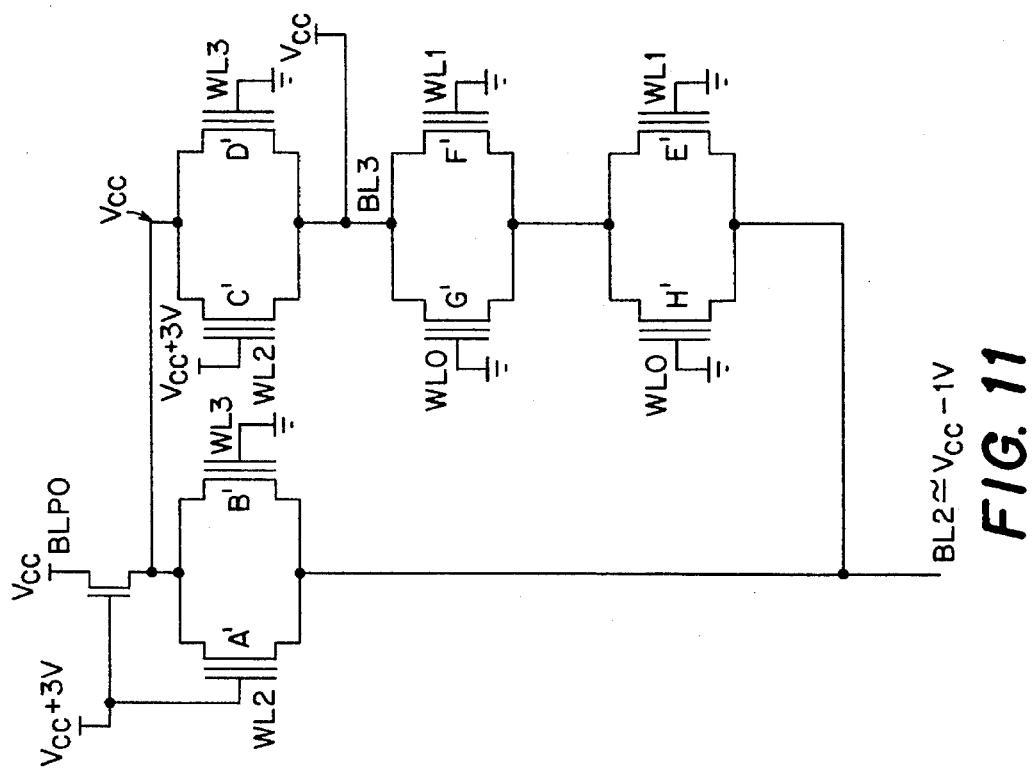
FIG. 11 shows the same view as in FIG. 10, relative to the array according to the present invention.

With the read method according to the present invention, however, no current is contributed by any depleted cells along possible parasitic paths. In fact, as shown in FIG. 11 similar to FIG. 10 but relative to the present memory array biased as described above, cells C' and D' (connected to the same source line 24 and the same bit line BL3 but to respective word lines WL2, WL3) present drain and source regions at the same potential $V_{cc}$, and consequently $V_{ds}$=0 V, thus preventing a parasitic current path being formed through them. The same also applies to all the other cells in the sector connected to the same or to an associated word line (i.e. with a common source line 24), thus providing for improvement as compared with the known technique.

Moreover, the read method according to the present invention also provides for reducing supply voltage for a given error probability tolerance. In fact, according to the present method, the cells connected to the addressed bit line present a floating terminal (normally operating as the source), and a terminal (normally operating as the drain) biased to $V_{cc}$−1. In this case, the biased terminal may operate as the source, and, if highly depleted, the cell may be turned on at certain $V_{gs}$ voltages (where the biased terminal is the source). To evaluate the degree of depletion required for a cell to be turned on under the above bias conditions, bear in mind that the threshold voltage $V_T$ of memory cells (as with MOS transistors) depends, among other things, on the difference in potential $V_{sb}$ between the source region and the body region (body effect), so that:

$$V_{gs,on} = V_{TO} + DV_T$$

where $V_{TO}$ is the threshold voltage of the cells when the source region is at the same potential as the substrate (ground), and depends on various factors, such as the fabrication process and temperature; and $DV_T$ is the increase in threshold voltage due to biasing the source region in relation to the substrate (bulk), and which approximately equals:

$$DVT = V_{sb}$$

where is a constant depending on the process (and normally ranging between 0.4 and 1.2); and $V_{sb}$ is the fall in potential between the source and substrate.

As such, positive biasing of the terminal which could possibly operate as the source and turn the cells on provides for increasing the threshold voltage of the nonselected cells, which thus, even if slightly depleted, in no way interfere with the reading. More specifically, the bias condition of the nonselected cells is equivalent to that produced by a voltage drop between the control gate and source:

$$V_{gs,eq} = -(V_{cc}-1\ V) - DV_T$$

so that they can only be turned on (when not selected) when they are so depleted that the threshold voltage is below $V_{gs,on}$.

For a typical process employed by the Applicant, it has been calculated that $V_{gs,eq}$=−2.3 V when $V_{cc}$=2.4 V, and $V_{gs,eq}$=−4.2 V when $V_{cc}$=3.6 V. Even under the worst low voltage supply conditions ($V_{cc}$=2.4 V), therefore, for the depleted nonselected cells to be turned on, the threshold voltage must be less than −2.3 V, that is, a gain of over 2 V as compared with the known technique has been achieved.

Figure 12:
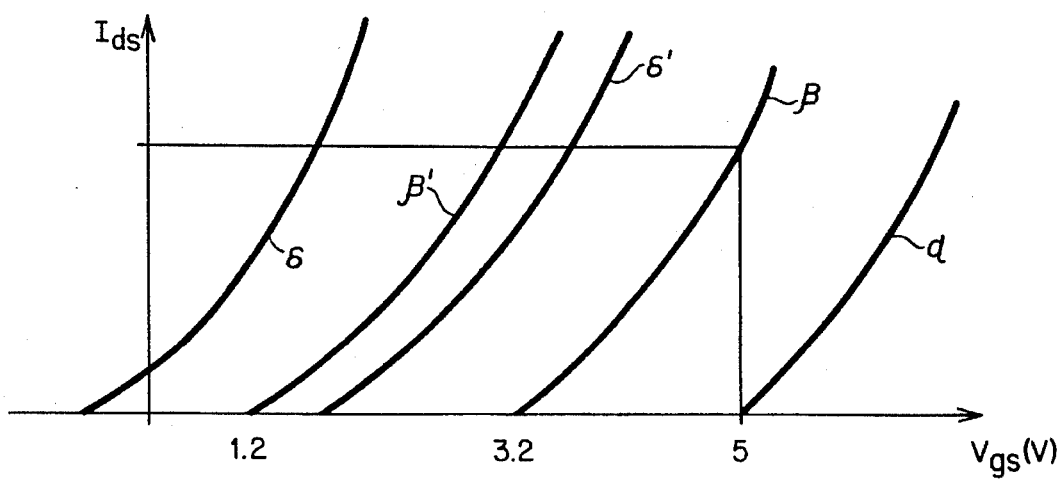
FIG. 12 shows the current-voltage characteristics of memory array cells.

This therefore enables a reduction in supply voltage $V_{cc}$. Supply voltage, in fact, is determined by the read voltage, which is selected equal to the maximum value (as determined by supply) so that it is as rapid as possible. With standard biasing, since the threshold of the written cells is roughly 5 V, the cells are erased until they present a threshold of roughly 3.2 V, so that, taking into account the bell-shaped threshold voltage dispersion curve, the slightly erased cells may also be read correctly without excessively reducing the threshold voltage of the depleted cells. In connection with the above, FIG. 12 shows a graph of the source-drain current $I_{ds}$, as a function of $V_{gs}$, of a written cell (curve α) and an erased cell (curve β) with VT equal to the mean value of the bell-shaped curve. In this case, all the addressed cells with $V_T$<5 V may be read correctly. FIG. 12 also shows curve δ relative to a depleted cell with a negative threshold voltage and which therefore conducts current, even when $V_{gs}$=0 V, thus possibly resulting in a read error as explained above.

In other words, for a given supply (and thus read) voltage, and a given depleted cell probability (as determined by the bell-shaped distribution curve), biasing as described above provides for raising the threshold of the nonselected cells and so also shifting the depleted cell curve accordingly. This corresponds to shifting curve δ rightwards to a positive $V_T$ value, instead of a negative one (curve δ'). Alternatively, as the architecture described provides anyway for only a small number of depleted cells, instead of reducing the number of depleted cells by raising the threshold voltage, it is possible to reduce the supply (and read) voltage by the gain in terms of an increase in the threshold voltage of the depleted cells. That is, if biasing as described provides for gaining 2 V as regards the threshold voltage, i.e. for shifting the curve of all the nonaddressed cells, including the depleted ones, by 2 V, the supply (and read) voltage may be reduced by the same 2 V with no change in the depleted cell probability as compared with the known read method (all other conditions remaining the same). This means shifting curve β leftwards (curve β') and the possibility of reading the selected cells, for example, at 3.2 V=$V_{cc}$.

Reducing the voltage as described above is particularly advantageous in view of the current tendency towards reducing the supply voltage of integrated circuits.

Though it may not appear so at first sight, the read method described involves practically no stress problems at the drain terminal of the nonaddressed cells (with $V_g=0$ V and $V_d=V_{cc}$). In fact, stress due to the electric field in the tunnel oxide area is maximum in the case of written cells with negative charges trapped in the floating gate region. According to the Applicant's calculations, current fabrication processes provide for a field through the tunnel oxide of E=5 MV/cm and a tunnelling current density of J=4.4 * 10–19 A/cm², the latter being calculated on the basis of the discharge current of a capacitor as per the Fowler-Nordheim equation.

The resulting current value, in the worst case of a tunnel area of 1 μm², corresponds to a threshold (erase) voltage shift of 1 V in roughly 70,000 years, and is thus totally negligible.

ARRAY 20: ERASE

In a flash-EEPROM array, all the cells in a given sector of the array are erased simultaneously. According to the known erase method, in the sector to be erased, all the word lines are grounded (0 V), all the source lines are brought to 12 V, and all the bit lines remain floating, so that the cells present a negative $V_{gs}$ of –12 V and a floating drain terminal.

According to the proposed method, biasing is inverted, so that all the bit lines in the sector to be erased are brought in known manner to a relatively high positive voltage (e.g. 12 V) derived from the $V_{pp}$ pin; all the word lines are kept grounded; and all the source regions are maintained floating.

With the above biasing, a strong electric field is developed between the floating gate and drain regions, and a negative charge is extracted from the floating gate towards the drain regions by Fowler-Nordheim tunnelling. By virtue of the graded junction in the drain region, this is capable of safely withstanding the high voltage applied; and, by virtue of inverting the graded junction (phosphorous doped) which in this case contacts the bit line in the form of a metal line, the funnel effect is substantially reduced.

Also, with the solution described, all the cells in the sector present exactly the same erase voltage, by virtue of the series resistance of the metal bit line being decidedly less than that of the source line (in the active area). For this reason also, threshold dispersion of the erased cells is thus reduced.

To prevent undesired stress on the other sectors, it is sufficient that the various sectors do not share the same metal bit lines. As shown in FIG. 4, the source lines formed in the active area are not shared by other sectors, thus preventing a parasitic path through a depleted cell from supplying high voltage to the source region of a cell in another sector which is not intended to be erased.

ARRAY 20: PROGRAMMING

As is known, cells are written (or "programmed") by injecting "hot electrons" into the floating gate region. At present, this is done by connecting the control gate to a high voltage (e.g. 12 V), grounding one terminal (source), and connecting the other terminal (drain) to a voltage below that of the gate (and normally ranging between 5 and 7 V). The electrons are thus accelerated by the longitudinal electric field between the source and drain, and so-called "hot electrons" (i.e. with above average energy) are generated close to the high-voltage terminal. Some of the hot electrons are injected through the thin tunnel oxide and are trapped in the floating gate region, thus resulting in a negative potential. As injection efficiency (i.e. the ratio between the drain current and floating gate current) is in the region of $10^{-7}$, the above programming method therefore requires large amounts of current (0.5 to 1 μA per cell) from the $V_{pp}$=12 V supply pin, which also supplies a voltage regulator integrated in the same chip and generating the voltage (5–7 V) applied to the drain terminal during programming.

According to one embodiment of the proposed method, however:

- the selected word line is brought to a high voltage (12 V);
- the selected bit line is brought to a low voltage (2 V);
- the other word lines are kept grounded (0 V);
- the other bit lines are left floating;
- the selected control bit line is kept at a fairly high voltage (6–7 V).

With the present method, no stress is produced on the drain terminal of the nonselected cells in the selected bit line, by virtue of the low voltage (2 V) applied.

The programming method described provides for improved reading efficiency by improving hot electron injection, due to the difference in potential between the substrate and drain (i.e. between the substrate and low-voltage terminal) being –2 V as opposed to zero, as in the known method.

Moreover, the proposed programming method also provides for reducing the parasitic paths by biasing the drain region (selected bit line) to 2 V, thus enabling the so-called body effect to be effectively exploited, as described in connection with the read step. Obviously, in the event the overerased (depleted) cells all present a threshold voltage of over –2 V (a reasonable assumption in most cases) all the parasitic paths are entirely cut off.

The proposed architecture also provides for correct self-timing during programming.

Using known architecture, in view of the fact that the bias voltages are reached, not instantaneously, but after a more or less steep transient state, the duration of which obviously also depends on the final voltage value, it is necessary, during programming, to prevent the drain terminal of the cell for programming from reaching a high voltage (5–7 V) before the control gate region reaches the operating potential (12 V). If not, stress is created at the drain terminal, and the cell begins conducting subthreshold current (the source terminal is grounded). As a result, some of the electrons trapped in the floating gate may be injected towards the channel region, thus depleting the cell, so that, at the next programming step, the cell fails to be programmed completely, and so resulting in a programming error (less than the required threshold voltage).

To prevent this from happening, the circuitry of known memories requires a timing logic, which provides for first applying the control gate voltage (12 V) and, only when this reaches the operating value, for biasing the bit line to the required voltage (7 V).

With the architecture described, however, by virtue of the self-timing characteristic of the selected cell, word and bit line biasing may be effected simultaneously. In fact, even in The event the selected bit line reaches the operating potential (2 V) before the selected word line reaches the operating value (12 V), the cell connected to it stays off by virtue of presenting a floating source region connected to the source region of the respective pass transistor, which is also off. The selected cell can only be turned on upon the selected word line reaching the operating voltage, thus turning on the relative pass transistor and so connecting the relative source line to the respective control bit line (BLP).

To those skilled in the art it will be clear that changes may be made to the memory and biasing method as described and illustrated herein without, however, departing from the scope of the present invention. In particular, it should be stressed that, though the memory array according to the present invention may be advantageously biased using the method described, it may also be read, programmed and erased using a known method.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A nonvolatile flash-EEPROM memory array including a plurality of bit lines, a plurality of source lines and a plurality of word lines, the memory array comprising:

a plurality of groups of memory cells arranged in rows and columns, each memory cell having a drain region connected to a respective one of the bit lines, a source region connected to a respective one of the source lines, and a control gate region connected to a respective one of the word lines;

a plurality of groups of control transistors corresponding to said plurality of groups of memory cells, each control transistor of the plurality of groups of control transistors presenting a gate region connected to a respective one of the word lines, and a source region connected to a respective one of the source lines;

a plurality of control bit lines corresponding to said groups of control transistors, each of the control transistors in each group of control transistors having a drain region connected to a respective one of the control bit lines;

wherein each source line connects source regions of each memory cell in each group and respective control transistors are separated from the source lines of other groups of memory cells;

wherein said groups of memory cells are integrated, adjacent to one another in a wafer of semiconductor material;

wherein each of said groups of control transistors is located between two adjacent groups of memory cells;

wherein said word lines extend parallel to and over the entire width of said array rows, said source lines extend parallel to said word lines and over portions of predetermined width less than said width of said array rows and equal to the width of each group of memory cells;

wherein the columns of said memory array are defined by first strips of semiconductor material defining said drain and source regions of said memory cells and separated partially by electrically insulating regions; characterized by the fact that said source and drain regions of said control transistors in each group of control transistors are formed in a respective second strip of semiconductor material extending parallel to said first strips of semiconductor material; each said second strip of semiconductor material being separated electrically from said first strips of semiconductor material defining said source and drain regions of a first group of adjacent cells, and being electrically connected to said first strips of semiconductor material defining said source and drain regions of a second group of adjacent cells via third strips of semiconductor material and defining the source lines of said second group of cells.

2. A memory array as claimed in claim 1, wherein lines of semiconductor material extend over the surface of said wafer of semiconductor material, and define said word lines; characterized by the fact that said lines of semiconductor material extend in straight lines over the entire width of said memory array, and define said gate regions of said control transistors; and said control bit lines include of metal lines extending parallel to said first and second strips of semiconductor material and over and isolated from said second strips of semiconductor material.

3. A memory array as claimed in claim 2, wherein said memory cells are formed in a substrate of semiconductor material defining a surface;

wherein each of said drain regions of said memory cells includes a first portion facing said surface and having a first doping level, and a second portion having a second doping level lower than said first level; said second portion surrounding said first portion on sides not facing said surface.

4. A memory array as claimed in claim 3, wherein said drain regions of said memory cells are doped with phosphorous, and said source regions of said memory cells are doped with arsenic.

5. A memory array according to claim 1, further comprising:

means for applying a positive voltage to a source region relative to a drain region of a cell to be read;

means for applying a positive voltage to a drain region relative to a substrate region of a cell to be erased; and means for applying a positive voltage to a source region relative to a drain region of a cell to be programmed.

6. A memory array according to claim 5, further comprising:

means for applying a supply voltage to a source line of the cell to be read;

means for applying a voltage higher than said supply voltage to a word line of the cell to be read;

means for floating source lines of other cells when a cell is to be read;

means for applying a potential of a substrate to word lines of other cells when the cell is to be read; and means for applying said supply voltage to bit lines of other cells when the cell is to be read.

7. The memory array of claim 5, further comprising:

means for applying a high voltage to a word line of the cell to be programmed;

means for applying a potential of a substrate to word lines of other cells when the cell is to be programmed;

means for floating bit lines of other cells when the cell is to be programmed.

8. A nonvolatile flash-EEPROM memory array including a plurality of bit lines, a plurality of source lines and a plurality of word lines, the memory array comprising:

a plurality of memory cells arranged in rows and columns, each memory cell having a drain region connected to a respective one of the bit lines, a source region connected to a respective one of the source lines, and a control gate region connected to a respective one of the word lines;

wherein said memory cells are formed in a substrate of semiconductor material defining a surface; wherein each said drain region of each said memory cell includes a first portion facing said surface and having a first doping level, and a second portion having a second doping level lower than said first level; said second portion surrounding said first portion on sides not facing said surface; and wherein each said source region of each said memory cell includes a single portion having a doping level approximately equal to said second doping level;

at least one control transistor corresponding to each of the word lines each of the at least one control transistors presenting a gate region connected to a respective one of the word lines, and a source region connected to a respective one of the source lines; and at least one control bit line, each of the at least one control transistor having a drain region connected to a respective control bit line, further comprising:

means for applying a positive voltage to a source region relative to a drain region of a cell to be read;

means for applying a positive voltage to a drain region relative to a substrate region of a cell to be erased; and means for applying a positive voltage to a source region relative to a drain region of a cell to be programmed.

9. A memory array according to claim 8, further comprising:

means for applying a supply voltage to a source line of the cell to be read;

means for applying a voltage higher than said supply voltage to a word line of the cell to be read;

means for floating source lines of other cells when the cell is to be read;

means for applying a potential of a substrate to word lines of other cells when the cell is to be read; and means for applying said supply voltage to bit lines of other cells when the cell is to be read.

10. The memory array of claim 8, further comprising:

means for applying a high voltage to a word line of the cell to be programmed;

means for applying a potential of a substrate to word lines of other cells when the cell is to be programmed;

means for floating bit lines of other cells when the cell is to be programmed.

* * * * *

UNITED STATES PATENT AND TRADEMARK OFFICE

CERTIFICATE OF CORRECTION

PATENT NO. : 5,508,956
DATED : April 16, 1996
INVENTOR(S): Giovanni Campardo, Giuseppe Crisenza and Marco Dallabora It is certified that error appears in the above-identified patent and that said Letters Patent is hereby corrected as shown below:

On the Title Page, at [75] it should read:

[75] Inventors: Giovanni Campardo, Bergamo; Giuseppe Crisenza, Trezzo Sull'Adda; Marco Dallabora, Melegnano, all of Italy Signed and Sealed this Thirtieth Day of July, 1996

Attest:

BRUCE LEHMAN

*Attesting Officer*     *Commissioner of Patents and Trademarks*